United States Patent [19]

Graupe et al.

[11] Patent Number: 4,783,818
[45] Date of Patent: Nov. 8, 1988

[54] METHOD OF AND MEANS FOR ADAPTIVELY FILTERING SCREECHING NOISE CAUSED BY ACOUSTIC FEEDBACK

[75] Inventors: Dan Graupe, Highland Park; John Grosspietsch, Schaumburg; Stavros P. Basseas, Chicago, all of Ill.

[73] Assignee: Intellitech Inc., Northbrook, Ill.

[21] Appl. No.: 788,411

[22] Filed: Oct. 17, 1985

[51] Int. Cl.⁴ .............................................. H03B 29/00
[52] U.S. Cl. ......................................... 381/71; 381/83; 381/93
[58] Field of Search ............................. 381/71, 83, 93

[56] References Cited

U.S. PATENT DOCUMENTS

| | | |
|---|---|---|
| 4,025,721 | 5/1977 | Graupe et al. |
| 4,088,835 | 5/1978 | Thurmond et al. ................ 381/83 |
| 4,185,168 | 1/1980 | Graupe et al. |
| 4,602,337 | 7/1986 | Cox ................................. 381/83 |
| 4,636,586 | 1/1987 | Schiff ............................... 381/71 |
| 4,689,821 | 8/1987 | Salikuddin et al. ................ 381/71 |

Primary Examiner—Forester W. Isen
Attorney, Agent, or Firm—Sandler & Greenblum

[57] ABSTRACT

A communication system, such as a hearing aid or a public address system, may include a microphone for inputting audio information to the system, an amplifier for amplifying audio frequency signals inputted to the microphone, and a speaker for outputting amplified audio frequency signals into the environment which provides an acoustic feedback path between the speaker and the microphone. The invention provides an identification circuit for dynamically identifying those parameters associated only with acoustic feedback, and a correction circuit whose transfer function is established in accordance with the parameters identified by the identification circuit. The transfer function of the correction circuit is such that the effect of acoustic feedback is cancelled from the transfer function of communication system. The identification circuit is constructed and arranged to identify said parameters in response to a turn-on of the system, or to an automatically-sensed threshold change in gain of the amplifier.

60 Claims, 4 Drawing Sheets

METHOD OF AND MEANS FOR ADAPTIVELY FILTERING SCREECHING NOISE CAUSED BY ACOUSTIC FEEDBACK

CROSS REFERENCE TO RELATED MATTERS

The following patents, helpful to an understanding of the present invention, are hereby incorporated by reference:

[1] U.S. Pat. No. 4,025,721, issued May 24, 1977; and
[2] U.S. Pat. No. 4,185,168, issued Jan. 22, 1980.

TECHNICAL FIELD

This invention relates to a method of and means for adaptively filtering screeching noise caused by acoustic feedback in communication systems such as hearing aids or public address systems.

BACKGROUND OF THE INVENTION

Hearing impaired persons fitted with hearing aids, as well as persons around them, are familiar with loud, unpleasant, and often uncomfortable, screeching noises that often eminate from a hearing aid when it is turned on, and at other times as well. Persons with normal hearing have experienced similar problems with public address systems. In both hearing aids and public address systems, hereinafter referred to as communication systems of the type described, which are used in acoustic environments, acoustic feedback is the culprit. That is to say, some of the acoustic energy radiated from the speaker of a communication system into the acoustic environment is picked up by the microphone of that same system, is amplified by the system's electronics, and then rebroadcast into the environment. Under some conditions, signal reinforcement, or bootstrapping, occurs; and the result is a screeching noise that is both loud, physically uncomfortable, and annoying to all those in the vicinity of the speaker.

Screeching noise caused by acoustic feedback is a major irritation to hearing aid users as well as to persons with unimpaired hearing in their vicinity, and to persons in the vicinity of a malfunctioning public address system. Conventionally, the user of a hearing aid controls screech caused by acoustic feedback by reducing the gain on the amplifier in the hearing aid, but this expedient solves the problem at the expense of a reduction in the level of amplification of information, which is the basis for wearing a hearing aid in the first place. In addition, manual adjustment of the volume of a relatively small hearing aid is usually difficult, or at least inconvenient. In public address systems, on the other hand, resort to rearranging the microphone is often the only practical way to alleviate screeching noise. Thus, the elimination of screeching noise in a communication system caused by acoustic feedback often requires manual intercession into the operation of such system which may be inconvenient or inappropriate. Apparatus that automatically, and adaptively, overcomes the problem of screeching noise caused by acoustic feedback would therefore be very desirable.

It is an object of the present invention to provide both a method of and apparatus for automatically and adaptively overcoming the problem of screeching noise caused by acoustic feedback in a communication system of the type described.

BRIEF DESCRIPTION OF INVENTION

The present invention is incorporated into a communication system of the type described which operates in an acoustic environment. The system includes a microphone component for inputting audio information, an amplifier component for amplifying audio frequency signals inputted into the microphone, and a speaker component for outputting amplified audio frequency signals into the environment which provides an acoustic feedback path between the speaker component and the microphone. According to the present invention, an identification circuit dynamically identifies those parameters associated with acoustic feedback, and a correction circuit, whose transfer function is established by the parameters identified by the identification circuit, and which is coupled to the amplifier component, cancels the effect of the acoustic feedback.

In order for the acoustic feedback parameters to be identified, the configuration of the communication system is altered from a conventional operational mode to a parameter identification mode. In its operational mode, the system is configured with the microphone coupled to the speaker through the amplifier of the system; and the speaker is coupled to the microphone through the acoustic medium of the environment. In its parameter identification mode, the amplifier is decoupled from the microphone and speaker and is replaced by an identifier circuit. By decoupling the amplifier according to the present invention, identification is performed in a manner that virtually ignores the amplifier and concentrates essentially only on the acoustics of the system. Identifying the parameters of the acoustics of the system is the goal of the present invention because it is these parameters that must be cancelled in order to eliminate acoustic feedback.

The identifier circuit, which is part of an identification circuit that also includes a pseudo-random noise generator, is a cross-correlation circuit that may be of type disclosed in Chapter 4 of the textbook *Identification of Systems*, D. Graupe, Krieger Publishing Company, Huntington, NY (1976) listed as reference [1] of U.S. Pat. No. 4,025,721 identified above. Such a cross-correlation circuit cross-correlates the signals that appear at each of two inputs to the circuit and produces either discrete or continuous time parameters as output. Instead of a cross-correlation circuit, the identifier circuit may utilize a least square minimization circuit (that minimizes a function of the squared integrated identification error), or a gradient, or a sequential gradient, minimization circuit (that minimizes the gradient of the squared integration identification error, e.g., using an iterative process in which minimization is done sequentially in time).

These last mentioned mimimization circuits are described in Chapters 5 and 7 of *Identification of Systems*. The parameters so obtained establish the transfer function of the correction circuit enabling the effect of acoustic feedback to be significantly reduced or eliminated.

In order to establish the configuration of the communication system, a two-state switch means, operated by switch control means, is interposed between the microphone and the amplifier, and between the speaker and the amplifier. In its first state, the switch means is effective to configure the system in its operational mode, i.e., the amplifier is interposed between the microphone and the speaker, and the identification circuit is not in the loop. When the switch means is in its second state, the system is configured in its parameter identification mode wherein the identifier circuit of the identification circuit replaces the amplifier, i.e., one input to the identifier circuit is connected to the microphone and the other input is connected to both the speaker and the noise generator. In this configuration, the output of the noise generator is injected both into the speaker and into one input of the identifier circuit. Some of the noise broadcast by the speaker is received by the microphone because of the acoustic coupling therebetween; and the received noise is applied to the other input of the identifier circuit.

The cross correlation between the noise directly injected into the identifier circuit, and the noise (and perhaps information that is uncorrelated with the noise) received by the microphone via the acoustic link between the speaker and the microphone, is a representation of a transfer function related to the individual transfer functions of the microphone, the speaker, and the acoustic link. In this way, the parameters associated with the acoustic feedback are dynamically identified by the identification circuit in prepration for establishing the transfer function of the correction circuit.

The identification process requires a finite time; and the switch control means maintains the switch means in its second state of a predetermined period interval of time. At the end of such time interval, the switch control means changes the state of the switch means from its second to its first state, and the configuration of the system is converted from its identification mode to its operational mode. At the same time, the identified parameters are applied to the correction circuit to establish a transfer function that is directly associated with the acoustic feedback as it existed during the time the system was operated in its identification mode. Both the correction circuit and the amplifier of the communication system are coupled between the microphone and speaker of the system in its operational mode, preferably in a simple feedback connection. Because the transfer function of the correction circuit is in accordance with the output of the identifier circuit during the identification mode, the presence of the correction circuit is effective to alter the system transfer function in a way that cancels the effect of acoustic feedback as long as it remains substantially the same as it was during the identification time interval.

As indicated above, the switch control means establishes the states of the switch means which, in turn, determine the configuration of the communication system. The switch control means senses turn-on of the system and monitors the gain of the amplifier or threshold increases in amplitude, or in the root-means square (RMS) amplitude of the output of the amplifier, or in the high frequency portion of such output. Such threshold increases are assumed to be caused by acoustic feedback. In response to system turn-on, or gain change, or a threshold change in the output of the amplifier, or in the high-frequency (e.g., above say 1200 Hz.) portion of the output of the amplifier, or at periodic intervals (e.g., every 60 seconds), the switch-control means forces the switch means into their second state and maintains them in such state for a predetermined period of time during which the system is configured in its identification mode. During this period of time, parameter identification takes place. At the end of the predetermined period of time, the switch control means is effective to return the switch means to their first state at which the communication system reverts to its operational mode. In this way, the present invention provides a dynamic and adaptive way to filter screeching noise caused by acoustic feedback from communication system without manual intercession.

BRIEF DESCRIPTION OF THE DRAWINGS

Embodiments of the present invention are illustrated in the accompanying drawings wherein.

DETAILED DESCRIPTION

Figure 1:
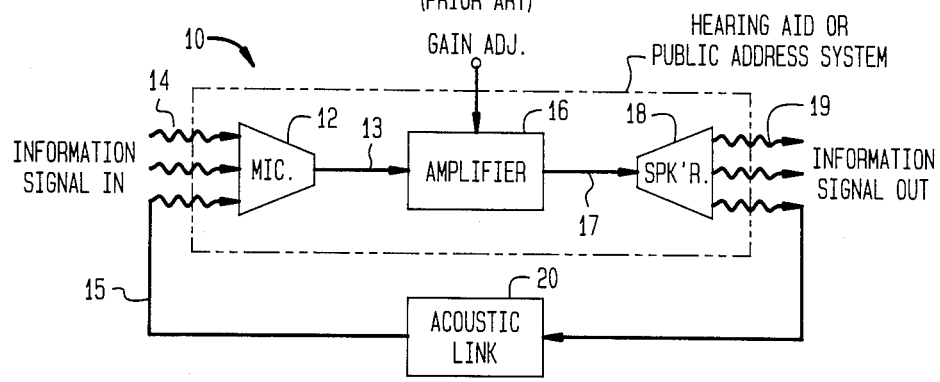
FIG. 1 is a schematic representation of a prior art hearing aid that is representative of a communications system into which the present invention can be incorporated.

Referring now to FIG. 1 of the drawings, reference numeral 10 designates a prior art communication system such as a hearing aid or public address system. Communication system 10 comprises microphone component 12 for producing an audio output signal on line 13 in response to audio signals, figuratively identified by lines 14 and 15, in an acoustic environment within which the communication system is located. System 10 further includes amplifier component 16 for producing an amplified output on line 17 in response to an audio input signal on line 13. Finally, system 10 includes speaker component 18 for producing audio signals, designated figuratively by reference numeral 19, that are broadcast into the acoustic environment in response to an input signal on line 17. For the purpose of illustrating the prior art, the acoustical environment within which the communication system is located provides an acoustic link designated figuratively by reference numeral 20 between speaker 18 and microphone 12.

As a consequence of the arrangement shown in FIG. 1, audio information broadcast by speaker 18 may be received by microphone 12, amplified in amplifier 16, and supplied to speaker 18 such that reinforcement occurs. The result is the familiar screeching noise associated with acoustic feedback.

Figure 2:
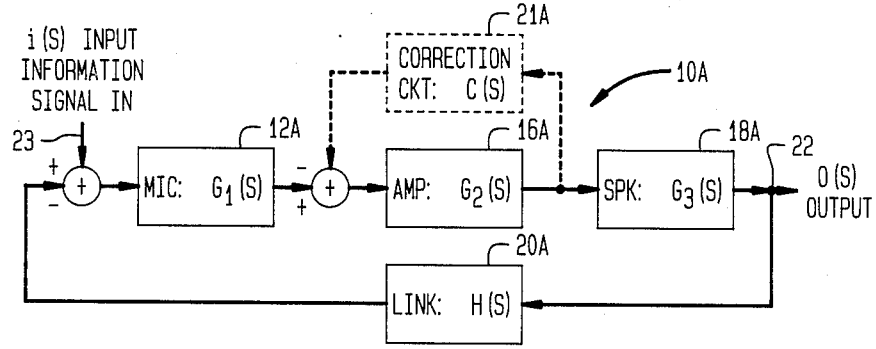
FIG. 2 is a schematic block diagram of the hearing aid shown in FIG. 1 illustrating the transfer functions of its components.

Reference is now made to FIG. 2 for the purpose of illustrating the problem of acoustic feedback in terms of the transfer function associated with each of the components shown in FIG. 1. Each of the components shown in FIG. 1, namely microphone 12, amplifier 16, speaker 18, and acoustic link 20 has associated with it a transfer function characteristic of the component. The transfer function of a component, as is well known, is the ratio of the Laplace transform of the output of the component to the Laplace transform of the input of the component. Expressed in this manner, the transfer function of a component is characteristic of the component regardless of the form of the input thereto.

In FIG. 2, the transfer function of the components shown in FIG. 1 are shown in corresponding blocks. That is to say, the transfer function of microphone 12 is $G_1(s)$ as indicated by block 12A, etc. The present invention contemplates the addition to the conventional circuitry in a communication system of a correction circuit, whose transfer function C(s) is such that the presence of the correction circuit in the communication system is effective to cancel the acoustic feedback link. Such a circuit is shown in FIG. 2 and is designated by reference numeral 21A. While correction circuit 21A is shown connected in feedback relationship to the amplifier component, it is also possible for the correction circuit to be connected serially, or in parallel, to the amplifier component but the resulting corrections and analyses are more complex.

By conventional circuit analysis, the transfer function of the entire communication system T(s) is defined as the Laplace transform of the output at point 22, in the circuit shown in FIG. 2, to the Laplace transform of the input at point 23 in the circuit. The circuit transform T(s) can be expressed as follows:

$$T(s) = o(s)/i(s) \quad (1)$$
$$= \frac{G_1(s)G_2(s)G_3(s)/[1 + G_2(s)C(s)]}{1 + G_1(s)G_2(s)G_3(s)H(s)/[1 + G_2(s)C(s)]}$$

where $G_1(s)$ is the transfer function of microphone 12, $G_2(s)$ is the transfer function of amplifier 16, $G_3(s)$ is the transfer function of speaker 18, and H(s) is the transfer function of acoustic link 20.

From inspection of Eq. (1), the effect of acoustic link 20 can be eliminated form the transfer function of the system provided that the transfer function of correction circuit 21A is adjusted, or is established, such that:

$$C(s) + H(s)G_1(s)G_3(s) = 0 \quad (2)$$

In the event that Eq. (2) is satisfied, Eq. (1) reduces to:

$$T(s) = G_1(s)G_2(s)G_3(s) \quad (3)$$

Eq. (3) represents the transfer function of the communication system when no acoustic link exists between the output and the input of the system. From inspection of Eq. (2), one can see that the product $G_1(s)G_3(s)H(s)$ must be identified rather than the quantity H(s), and the transfer function of the correction circuit must be set in accordance with Eq. (2).

Basically, the present invention provides an acoustic feedback identification circuit for selectively identifying those parameters associated with acoustic feedback between the speaker and microphone components of a communication system, and an adaptive correction circuit component which is coupled to the amplifier component, and which has a transfer function established by the parameters identified by the acoustic feedback identification means. In order to achieve this end, the present invention also includes configuration means for interconnecting the components such that the acoustic feedback identification circuit first identifies the parameters associated with acoustic feedback between the speaker and the microphone, and then, automatically, and self adaptively, establishes the transfer function of the correction circuit such that the latter is effective to cancel acoustic feedback.

Figure 3:
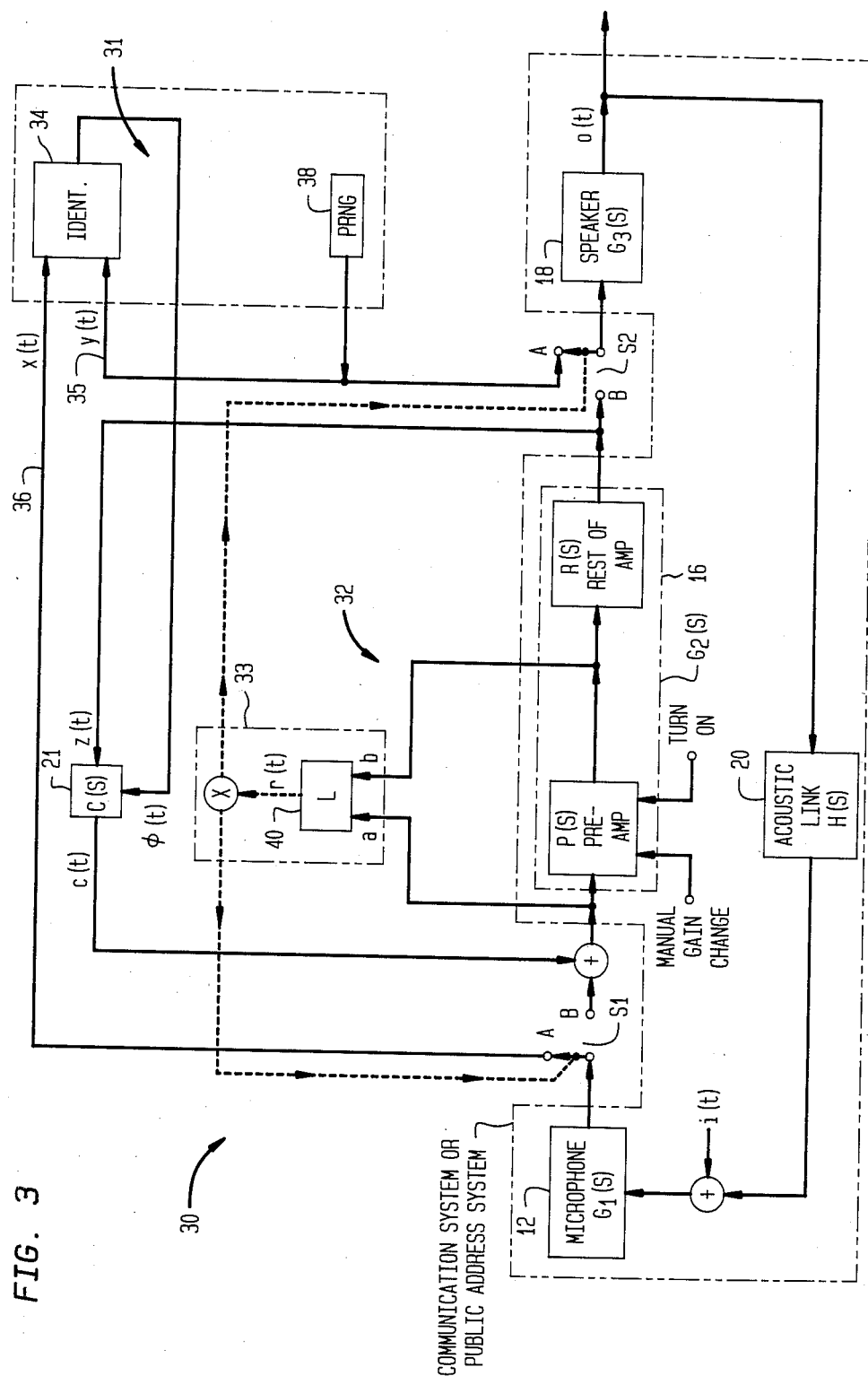
FIG. 3 is a block diagram of the present invention incorporated into a communication system such as a hearing aid housing or a public address system.

Apparatus according to the present invention is designated by reference numeral 30 in FIG. 3 to which reference is now made. This figure is similar to FIG. 2 in that the transfer functions of the components of the communication system are illustrated in FIG. 3. That is to say, the microphone component of the system is illustrated by block 12, the amplifier component is represented by block 16, the speaker of the system is represented by block 18, the acoustic feedback link is indicated by block 20, and the correction circuit is represented by block 21. Apparatus 30 also includes acoustic feedback identification means 31 and configuration means 32.

Configuration means 32 includes two-state switches S1 and S2, and switch control means 33 for establishing and maintaining the state of the switch means. In one state, the switch means is effective to interconnect the microphone to the speaker through the amplifier component thus establishing what is termed, herein, the operational configuration of the components. In the other state of the switch means, the components are connected in what is termed an identification configuration in which identification means 31 is substituted for amplifier component 16.

Identification means 31 comprises identifier circuit 34 (see details in FIG. 4) which, as explained below, cross correlates the signals appearing at first input 35 and second input 36, and produces an output signal at 37 which is applied to correction circuit 21A. In addition to identifier circuit 34, identification means 31 also includes pseudo-random noise generator 38 connected to the first input terminal 35 of the identifier circuit.

Switch S2 of configuration means 32 is an electronic switch but is shown schematically in FIG. 3 for the purpose of simplifying the explanation of the invention. As seen in FIG. 3, switch S2 has a first state in which the output of amplifier component 16 of the system is connected to the speaker (position B) and a second state at which the input to the speaker is connected to noise generator 38 (position A). The configuration means also includes switch S1, which, in its first state (position B) connects the output of the microphone component to the input of the amplifier component, and a second state (position A) in which the output of the microphone is connected to input 36 of identifier 34. In normal operation, configuration means 32 maintains switches S1 and S2 in their first state such that the communication system is configured in an operational mode and the circuit thus established resembles that shown in FIGS. 1 and 2.

As indicated previously, configuration means 32 also includes switch control means 33 for controlling the state of switches S1 and S2. In a manner described below, the switch control means is responsive to a threshold change in the gain of amplifier component 16 for switching switches S1 and S2 from their first to their second state for a predetermined interval of time. In addition, switch control means 32 is also responsive to a turn-on condition of the amplifier component for switching switches S1 and S2 from their first to their second state for a predetermined interval of time.

When switches S1 and S2 are in their second state, the output of microphone component 12 is supplied to input 36 of identifier 34, and the output of noise generator 38 is applied to first input 35 of identifier 34 and to speaker 18. Noise from generator 38 is thus broadcast by speaker 18 into the ambient environment within which the communication system is located, and some of this noise is picked up, via acoustic link 20, by microphone 12 in addition to whatever information, such as speech, is also present in the environment. Thus, the input to identifier 34 is noise received directly from generator 38 as well as noise transmitted via acoustic link 20 between the speaker and the microphone. In a manner explained in Chapter 4 of "Identification of Systems" by D. Graupe, Krieger Publishing Co., Huntington, N.Y., (1976), and described below, identifier circuit 34 cross correlates the signals appearing at the first and second inputs 35 and 36, respectively, of the identifier and produces parameters that identify the acoustic line. While the input to the identifier supplied by the microphone may contain some intelligence, there is no correlation between it and the noise, and for this reason the presence of the intelligence does not affect the operation of identifier circuit 34 in a significant manner.

The parameters thus identified by identifier circuit 34 are applied to correction circuit 21 in a manner that establishes a transfer function for the correction circuit which satisfies Eq. (2). A finite time is required for the identifier circuit to generate the parameters associated with the acoustic feedback link, generally less than one second. After identification is complete, switch control means 32 becomes effective to reconfigure the communication circuit from its identification mode back to its operational mode by changing the state of switches S1 and S2 from their second state to their first state. Thereafter, the transfer function of the communication system will satisfy Eq. (3) with the result that the transfer function of the system in its operational mode eliminates acoustic feedback. Thus, the present invention prevents the communication system from producing screeching noise associated with acoustic feedback.

Summarizing the operation of the present invention, powering up the communication is sensed by switch control means 33 and is effective to configure the communication system into its identification mode as shown in FIG. 3. In this mode, the amplifier component, and the correction circuit that is feedback-connected thereto, are effectively removed from the communication system and identifier circuit 34 substituted therefor. In this configuration, the identifier circuit produces parameters which establish the transfer function of the correction circuit in a manner that solves Eq. (2). After identification is complete, switch control means 32 is effective to change the state of switches S1 and S2 to their first state where the identification means is disconnected from the communication system which operates in a conventional manner in the sense that the output of the microphone is amplified by the amplifier component and applied to the speaker component.

The switch-control means is also responsive to a threshold change in the gain of the amplifier component for the purpose of switching the state of the switches S1 and S2 from their first to their second state for a predetermined period of time sufficient for parameter identification to occur. Thereafter, the switch control means is effective to reconfigure the system from its identification mode to its operational mode.

Figure 4:
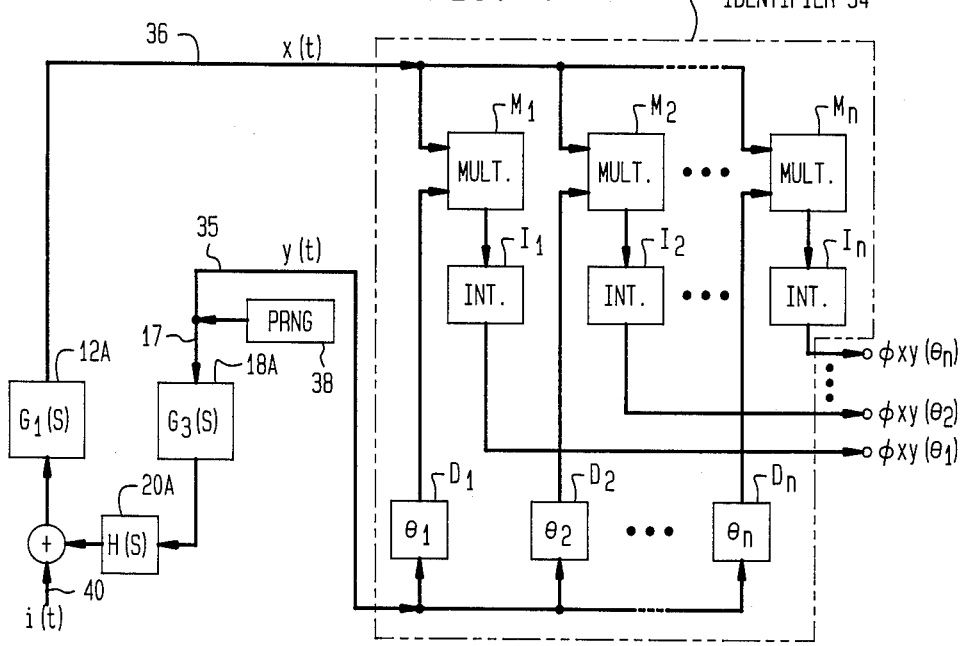
FIG. 4 is a block diagram of the device shown in FIG. 3 configured to operate in a parameter identification mode.

For an explanation of the identification process carried out by the identification circuit in FIG. 3, reference is made to FIG. 4 which shows the configuration of the communication system during its identification mode. That is to say, the output of microphone component 12 is applied to the second input 36 of identifier circuit 34 and the output of noise generator 38 is applied to first input 35 of the identifier circuit. Nose from the generator is also applied to speaker component 18 whose is output is linked by the acoustic environment to microphone component 12. For reference purposes, the acoustic link between the speaker component and the microphone component is designated by reference numeral 20. Intelligence picked up by microphone component 12 is indicated at 40 in FIG. 4.

Identifier 34 is constructed in accordance with chapter 4 of *Identification of System*, D. GRAUPE, Krieger Publishing Company, Huntington, NY (1976), listed as reference [1] in the reference of U.S. Pat. No. 4,025,721. Thus, the signal received by identifier circuit 34 from microphone 12 is applied in parallel to a series of multipliers designated $M_1, M_2, \ldots M_n$. The output of noise generator 38 is applied in parallel to a series of delay circuits $D_1, D_2, \ldots D_n$; and the output of corresponding delay circuits is applied, individually, to the multipliers. The outputs of each of the multipliers is integrated by integrators $I_1, I_2, \ldots I_n$ for a predetermined period of time, typically about one second, producing, as shown in FIG. 4, a series of discrete time parameters. If the inputs to identifier circuit 34 are designated x(t) and y(t), the discrete output parameters may be identified as $\phi_{xy}(\phi_1), \phi_{xy}(\phi_2), \ldots \phi_{xy}(\phi_n)$.

Chapter 4 in the reference referred to above also discloses a way in which the parameters can be continuous time parameters instead of discrete time parameters. Thus, an identifier according to the present invention can produce either discrete time parameters, or continuous time parameters. In either case, all of the parameters are pole parameters; namely, they are autoregressive.

Figure 5:
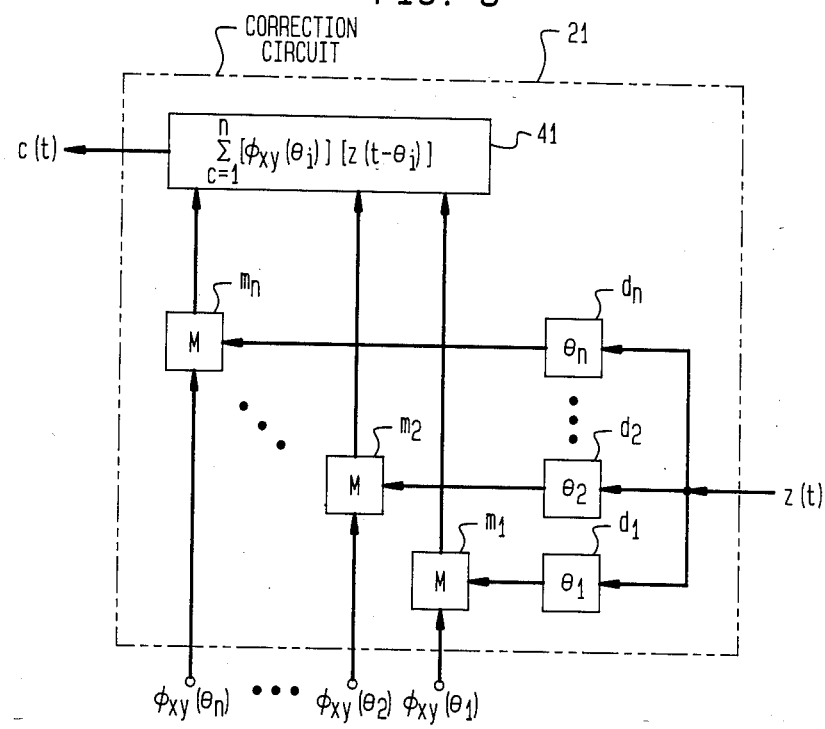
FIG. 5 is a schematic block diagram of the correction circuit shown in FIG. 3.

The discrete time parameters produced as the output of identifier circuit 34 are applied to correction circuit 21 in the manner shown in FIG. 5. During operation of the communication system in its operational mode, the output of amplifier component 16 is applied to the input of correction circuit 21, and this input is designated by z(t). As shown in FIG. 5, the input signal z(t) is applied in parallel to delay circuits $d_1, d_2, \ldots d_n$ where the delays of these delay circuits respectively correspond to the delays associated with identifier circuit 34. The outputs of the delay circuits in correction circuit 21 are individually multiplied by multipliers $m_1, m_2, \ldots m_n$ as shown in FIG. 5 and applied to adder circuit 41, which produces output signal C(t) that is fed back into the input of amplifier component 16. In this way, correction circuit 21 is configured by the parameters identified by identifier circuit 34 to have a transfer function that satisfies Eq. (2). As a result, the acoustic feedback link does not affect the communication circuit during its operational mode.

Figure 7:
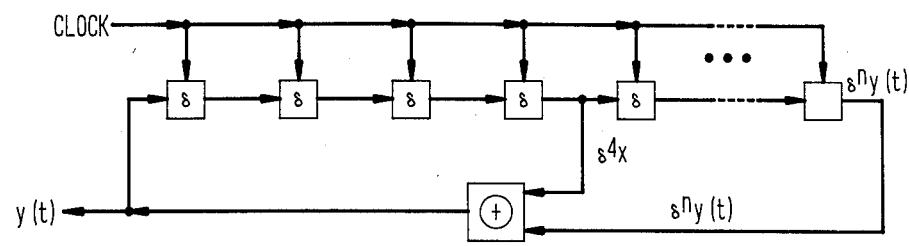
FIG. 7 is a block diagram showing one type of noise generator shown in FIG. 3.

One embodiment of a suitable pseudo-random noise generator is illustrated in FIG. 7 as a pseudo-random binary noise generator circuit. This circuit is described in reference [1] referred to previously. Essentially, a clock signal is applied in parallel to a series of delay circuits, the output of which is combined, in an exclusive-OR circuit, to produce an essentially "white" noise signal. Other types of noise generators that produce "white" noise can be used with the present invention, however. Instead of using a noise-generator, as such, the noise may be pre-recorded and stored in memory. In such case, the noise generator is the memory and the circuitry for reading out the memory.

Figure 8:
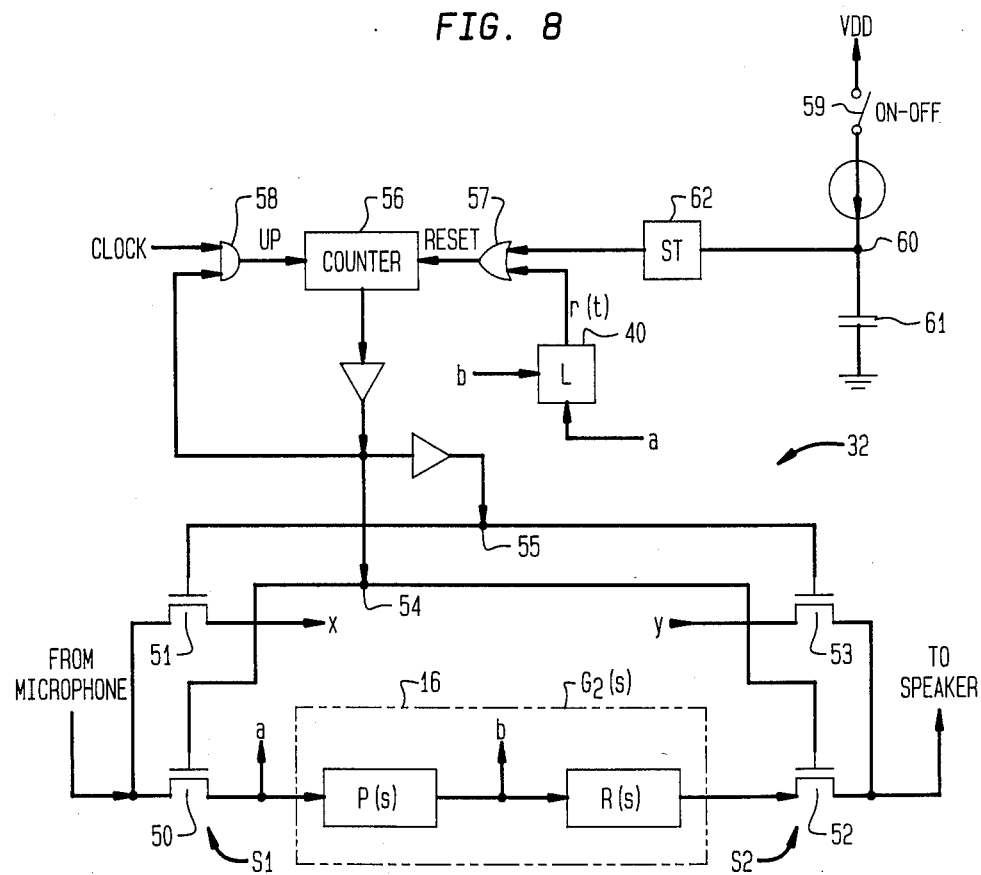
FIG. 8 is a block diagram showing electronic switch means by which the microphone and speaker are connected to the amplifier means of the system and the switch control means for controlling the switch means.

An embodiment of configuration means 32 (FIG. 3) used with the present invention is shown in FIG. 8. Here, switch S1 is constituted by a pair of pass transistors 50 and 51, and switch S2 is constituted by a pair of pass transistors 52 and 53. When pass transistors 50 and 52 are enabled by a high level of node 54, the switches configure the communication system in its operational mode because the output from the microphone component is applied, via conducting pass transistor 50, to the input of amplifier component 16, and the output of the amplifier component is applied to the speaker by way of conducting pass transistor 52. On the other hand, when node 55 is high and node 54 is low, pass transistors 51 and 53 conduct, and pass transistors 50 and 52 are rendered non-conductive. The conduction of transistors 51 and 53 configure the communication system in its identifier mode because the output from the microphone component is applied, via conduction of transistor 51, to the input of identifier circuit 34 (i.e., "x"); and the output of identifier circuit 34 (i.e., "y") is applied to the speaker component by way of conducting transistor 53.

The voltages at nodes 54 and 55 are controlled by the resetting of counter 56. In operation, a reset signal produced by OR-gate 57 resets counter 56. The resetting of this counter causes the voltage at node 55 to go high and the voltage at node 54 to go low. As a consequence, the switch control means configures the communication system into its identification mode. The system remains in this mode until counter 56 reaches a predetermined number, counting from zero being commenced by the application of the output of AND gate 58 to which clock pulses are applied. The time required for the counter to count from zero to the preselected number is dependent upon the amount of time required for identifier 34 to identify the parameters associated with the acoustic feedback link. In any event, once the counter reaches this predetermined number, the output thereof switches the voltage at nodes 54 and 55 such that the voltage at node 54 becomes high and the voltage at node 55 becomes low thereby causing the switch control means to convert the communication system from its identification mode back to its operational mode.

OR-gate 57 produces an output when either of two situations occur: powering up the amplifier by closing on/off switch 59, or by a signal r(t) applied to OR-gate 57. When switch 59 is closed, the voltage at node 60 begins to rise from ground level at a rate depending upon the time constant associated with capacitor 61 and the resistance in the circuitry of the power supply of the communications system until a threshold level is reached at which Schmidtt trigger 62 is activated producing a step-voltage output that is applied to OR-gate 57. In response, counter 56 is reset and the system is configured to its identification mode. Thus, after a small delay following powering up the system to allow the components to become operational, the switch control means is effected to configure the communication system into its identification mode.

Figure 6:
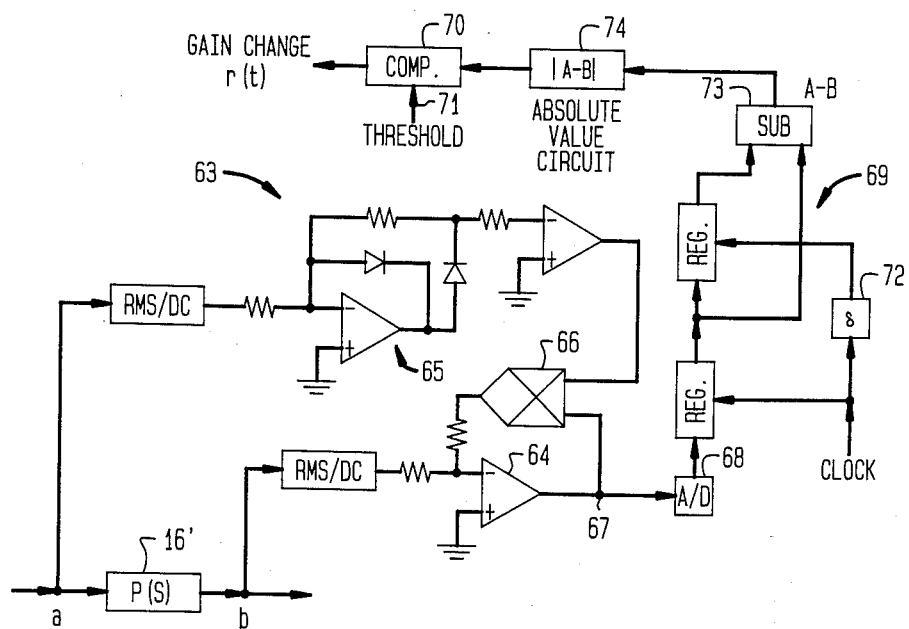
FIG. 6 is block diagram of an embodiment of logic circuit which provides for the sensing of gain changes in the amplifier means of the apparatus shown in FIG. 3.

The signal r(t) shown in FIG. 8 is produced by gain-sensor circuit 40 in response to a threshold change in gain of the amplifier component of the communication system. Gain sensor circuit 40 for generating signal r(t) is shown in FIG. 6. As shown therein, circuit 63 senses threshold changes in the gain of pre-amplifier 16' that is the gain-adjustable part of amplifier component 16. Specifically, circuit 63 computes the ratio of the output b of preamplifier 16' to its input a, continuously applies the ratio to a comparator, and produces an output when the change in gain across the pre-amplifier exceeds a threshold. The divisional operation by which the ratio of the output to the input of the pre-amplifier is done in an analog manner as shown in FIG. 6, but the operation could also be done digitally if desired.

As shown in FIG. 6, the output of the pre-amplifier is applied to a convertor which converts the root=mean-square of the signal at the output of the pre-amplifier to a dc voltage proportional to the root-mean-square of the output signal and applies this to operational amplifier 64. The same procedures apply to the input signal of the preamplifier, but this is limited at 65, and applied to one side of divider circuit 66. The other side of this divider circuit is taken from the output of operational amplifier 64 as shown. Thus, the voltage appearing at node 67 is a voltage proportional to the ratio of the output of preamplifier 16' to its input, i.e., to the gain of the preamplifier. This voltage is converted into a digital signal at 68, and digitally processed at 69 where the difference between this gain value and its value as delayed by delay element 72, are subtracted in difference circuit 73. The output of difference circuit 73 is then passed through absolute value circuit 74 and the subsequent absolute value of the difference is applied to comparator 70. The comparator is also supplied with a threshold signal at 71 for the purpose of comparing changes in gain of the pre-amplifier to some fixed level. When this gain reaches the threshold, comparator 70 produces the gain change signal r(t).

The advantages and improved results achieved by the method and apparatus of the present invention are apparent from the foregoing description of the preferred embodiment of the invention. Various changes and modifications may be made without departing from the spirit and scope of the invention as described in the claims that follow.

What is claimed is:

1. A method to control acoustic feedback in a communications system operating in an acoustic environment and having a microphone component for inputting audio information into the system, an amplifier component for amplifying audio frequency signals inputted to the microphone, and a speaker component for outputting audio frequency signals into said environment, said method comprising:
   (a) identifying those parameters associated with acoustic feedback, including identifying time-variations in these parameters;
   (b) adjusting the transfer function of said amplifier component in accordance with the identified parameter for cancelling the effects of said acoustic feedback in response to identification of the parameters associated therewith without attenuating any audio frequencies.

2. A method according to claim 1 including the step of configuring the communication system in an identification mode before parameter identification is carried out, and configuring the system to operate in an operational mode after parameter identification is carried out, the cancelling of the effects of said acoustic feedback being done while the system is configured in its operational mode.

3. A method according to claim 2 including the step of monitoring the condition of the communication system for effecting a change in configuration of the system from its operational to its identification mode when a predetermined condition exists.

4. A method according to claim 2 wherein the step of cancelling the effects of said acoustic feedback includes establishing the transfer function of a correction circuit in accordance with the identified parameters, and coupling said correction circuit to said communication system when it is configured in its operational mode.

5. A method to control acoustic feedback in a communication system operating in an acoustic environment and having a microphone component for inputting audio information to the system, an amplifier component for amplifying audio frequency signals inputted to the microphone, and a speaker component for outputting said audio frequency signals into said environment, said method comprising:
(a) identifying those parameters associated with acoustic feedback, including identifying time-variations in these parameters;
(b) adjusting the transfer function of said amplifier component in accordance with the identified parameters for cancelling the affects of said acoustic feedback in response to identification of parameters associated therewith;
(c) configuring the communication system to operate in an identification mode before parameter identification is carried out;
(d) configuring the communication system to operate in an operational mode after parameter identification is carried out, the cancelling of the effects of said acoustic feedback being done when the system is configured in its operational mode; and
(e) wherein the communication system is configured in its identification mode by disconnecting said speaker from said amplifier means, and parameter identification is achieved by injecting a noise signal into said speaker, and cross-correlating the output of said microphone with said noise signal while said speaker is disconnected from said amplifier means.

6. A method according to claim 5 including the step of maintaining the configuration of the system in its identification mode for a predetermined period of time after the configuration is changed from its operational to its identification mode.

7. A method according to claim 6 wherein said predetermined condition is system turn-on, or a threshold change in the gain of the amplifier component.

8. A method according to claim 7 wherein the identification of said parameters is carried out independently of audio information inputted into the microphone.

9. A method according to claim 7 wherein the communication system is configured in its identification mode by disconnecting said speaker from said amplifier means, and parameter identification is achieved by injecting a noise signal into said speaker, and cross-correlating the output of said microphone with said noise signal while said speaker is disconnected from said amplifier means.

10. A method according to claim 5 wherein said noise signal is pseudo-random.

11. Apparatus according to claim 5 wherein the communication system is reconfigured by terminating injection of noise into said speaker, and reconnecting said speaker to said amplifier means.

12. A method according to claim 5 wherein said noise signal is provided from a pre-recording stored in memory.

13. A method according to claim 5 wherein the step of configuring the communication system in an identification mode before parameter identification is carried out, and after parameter identification is carried out, the cancelling of the effects of said acoustic feedback being done while the system is configured in its operational mode, and including the step of cancelling the effects of said acoustic feedback and establishing the transfer function of a correction circuit in accordance with the identified parameters, and coupling said correction circuit to said communication system when it is configured in its operational mode.

14. A method according to claim 13 wherein said noise is pseudo-random.

15. In an audio system operating in an acoustic environment and having a microphone for inputting audio information into the system, amplifier means for amplifying audio frequency signals inputted to the microphone, and a speaker for outputting amplified audio frequency signals into said environment which provides acoustic feedback between said speaker and said microphone, the improvement comprising:
(a) an identification circuit for dynamically identifying those parameters associated with said acoustic feedback;
(b) correction circuit means having a transfer function set in response to parameters identified by said identification means for cancelling the effect of said acoustic feedback; and
(c) wherein said identification circuit includes an identifier circuit having two inputs for cross-correlating the signals at said inputs, a noise generator for generating a noise signal that is applied to one of said inputs, switch means having a first state that connects said speaker to said amplifier means and disconnects said noise generator from said speaker, and having a second state that disconnects said speaker from said amplifier means and connects said noise generator to said speaker, and means for applying the output of said microphone to the other of said inputs of said identification circuit while said switch means is in its second state.

16. The invention of claim 15 including switch control means for controlling the state of said switch means.

17. The invention of claim 16 including gain sensor means operatively associated with said amplifier means for sensing changes in the gain of said amplifier means; and wherein said switch control means is responsive to said gain sensor means for maintaining said switch means in its first state until the occurrence of either turn-on of the system, or a predetermined change in the gain of said amplifier means, and then changing the switch means to its second state.

18. The invention of claim 17 wherein said switch control means is constructed and arranged to maintain the switch means in its second state for predetermined period of time before effecting a change of the switch means to its first state.

19. The invention of claim 17 wherein said amplifier means includes manually adjustable means for controlling the gain of said amplifier means, and said gain sensor means is responsive to the adjustment of said manually adjustable means for controlling the state of said switch means.

20. The invention of claim 17 wherein said amplifier means is a preamplifier stage, and the gain sensor means is responsive to the voltage across the preamplifier stage.

21. The invention of claim 20 wherein said gain sensor means includes a divider-limiter circuit.

22. The invention of claim 21 wherein said divider limiter includes circuit for dividing the voltage appearing across the input and output of said preamplifier stage.

23. The invention of claim 15 wherein said identification circuit is constructed and arranged to produce discrete time parameters associated with said accoustic feedback.

24. The invention of claim 15 wherein said identification circuit is constructed and arranged to produce continuous time parameters associated with said accoustic feedback.

25. The invention of either of claims 23 or 24 wherein said identification circuit is constructed and arranged to produce only pole parameters.

26. The invention of claim 25 wherein said identification circuit is constructed and arranged to produce autoregressive parameters.

27. The invention of claim 16 including an amplitude sensor responsive to the output of said amplifier means for sensing a rise in amplitude of such output above a predetermined value, and wherein said switch-control means is constructed and arranged to maintain said switch means in its first state until occurrence of either a condition of turn-on of the system, or a condition of a rise in amplitude of the output of said amplifier above said predetermined value, and to change said switch means to its second state in response to occurrence of either condition, said switch-control means being further constructed and arranged to maintain said said switch means in its second state for a predetermined period of time and to thereafter change the state of said switch means to its first state.

28. The invention of claim 27 wherein said sensor is responsive to a rise in amplitude of only those frequency components in the output of said amplifier which have a frequency exceeding a predetermined value.

29. In an accoustic environment, apparatus comprising:
(a) a microphone component for responding to audio signals in said accoustic environment which are received by the microphone to produce an audio output signal;
(b) an amplifier component for producing an amplified output signal in response to an audio input signal;
(c) a speaker component for producing an audio signal broadcast into the acoustic environment in response to an input signal;
(d) acoustic feedback identification means for selectively identifying those parameters associated with accoustic feedback between the speaker and the microphone;
(e) an adaptive correction circuit component coupled to said amplifier component and having a transfer function established by the parameters identified by said accoustic feedback identification means; and
(f) configuration means for interconnecting the components such that said adaptive correction circuit component is effective to cancel said acoustic feedback without attenuating audio frequencies feedback.

30. Apparatus according to claim 29 wherein said configuration means is selectively operable for alternately connecting the components into an identification configuration that includes said acoustic feedback identification means, or into an operation configuration that excludes said acoustic feedback identification means.

31. Apparatus according to claim 30 wherein said configuration means includes two-state switch means, and switch control means for establishing and maintaining the state of said switch means, one state of said switch means interconnecting said microphone component to the speaker and amplifier components and disconnecting the acoustic feedback identification means from the components thereby establishing the operation configuration of the system.

32. The apparatus of claim 31 wherein said apparatus is a part of a public address system.

33. In an acoustic environment, apparatus comprising:
(a) a microphone component for producing an audio output signal and responsive to audio signals in said acoustic environment which are received by the microphone;
(b) an amplifier component for producing an amplified output signal in response to an audio input signal;
(c) a speaker component for producing an audio signal broadcast into the acoustic environment in response to an input signal;
(d) acoustic feedback identification means for selectively identifying those parameters associated with acoustic feedback between the speaker and the microphone;
(e) an adaptive correction circuit component coupled to said amplifier component and having a transfer function established by the parameters identified by said acoustic feedback identification means;
(f) configuration means for interconnecting the components such that said adaptive correction circuit component is effective to cancel said acoustic feedback;
(g) said configuration means being selectively operable for alternately connecting the components into an identification configuration that includes said acoustic feedback identification means, or into an operation configuration that excludes said acoustic feedback identification means;
(h) said configuration means including two-state switch means, and switch control means for establishing and maintaining the state of said switch means, one state of said switch means interconnecting said microphone component to the speaker and amplifier components and disconnecting the acoustic feedback identification means from the components thereby establishing the operation configuration of the system;
(i) wherein said acoustic feedback identification means includes: (1) an identifier circuit having first and second inputs for cross-correlating signals at said inputs and producing an output signal; and (2) a noise generator connected to said first of the inputs of said identifier circuit; (3) the other state of said switch means connecting the speaker component to said first of the inputs to said identifier circuit for effecting injection of noise from said noise generator into said identifier circuit and into said speaker, and connecting the microphone component to said second of the inputs to said identifier circuit for applying to the latter signals received by the microphone component due, in part, to the acoustic coupling between said speaker and said microphone.

34. Apparatus according to claim 33 including a hearing aid housing containing said apparatus.

35. The invention of claim 33 wherein said switch control means is responsive to a threshold change in the gain of said amplifier component for switching said switch means from its first to its second state.

36. The apparatus of claim 35 wherein said switch control means is responsive to a turn-on condition of said amplifier component for switching said switch means from its first to its second state for a predetermined period of time.

37. Apparatus according to either of claims 35 or 36 wherein said noise generator generates pseudo-random noise.

38. Apparatus according to claim 37 wherein said switch control means is constructed and arranged to maintain said electronic switch in its second state for a preselected period of time.

39. Apparatus according to claim 38 wherein said identifier circuit produces discrete time parameters.

40. The invention of claim 38 wherein said identifier circuit produces continuous time parameters.

41. Apparatus according to claim 40 wherein said parameters are pole parameters.

42. Apparatus according to claim 41 wherein said parameters are autoregressive parameters.

43. In an audio system operating in an acoustic environment and having a microphone for inputting audio information into the system, amplifier means for amplifying audio frequency signals inputted to the microphone, and a speaker for outputting amplified audio frequency signals into said environment which provides acoustic feedback between said speaker and said microphone, the improvement comprising;
(a) an identification circuit for dynamically identifying those parameters associated with said acoustic feedback; and
(b) correction circuit means having a transfer function set in response to parameters identified by said identification means for cancelling the effect of said acoustic feedback without attenuating any audio frequencies.

44. The invention of claim 43 wherein said identification circuit is constructed and arranged to identify said parameters in response to a condition selected from the group of conditions: turn-on of the system, and gain a change in said amplifier means.

45. The invention of claim 44 wherein said identification circuit includes means responsive to threshold changes in said acoustic feedback for effecting identification of the parameters thereof.

46. A method to control acoustic feedback in a communications system operating in an acoustic environment and having a microphone component for inputting audio information into the system, an amplifier component for amplifying audio frequency signals inputted to the microphone, and a speaker component for outputting audio frequency signals into said environment, said method comprising;
(a) identifying those parameters associated with acoustic feedback, including identifying time-variations in these parameters;
(b) adjusting the transfer function of said amplifier component in accordance with the identified parameters for cancelling the effects of said acoustic feedback in response to idenfification of the parameters associated therewith;
(c) configuring the communication system to operate in an identification mode before parameter identification is carried out;
(d) configuring the communication system to operate in an operational mode after parameter identification is carried out, the cancelling of the effects of said acoustic feedback being done while the system is configured in its operational mode;
(e) cancelling the effects of said acoustic feedback by establishing the transfer function of a correction circuit in accordance with the identified parameters;
(f) coupling said correction circuit to said communication system when it is configured in its operational mode; and
(g) wherein the step of configuring the communication system in its identification mode is carried out by disconnecting said amplifier component from said microphone and speaker components.

47. A method to control acoustic feedback in a communications system operating in an acoustic environment and having a microphone component for inputting audio information into the system, an amplifier component for amplifying audio frequency signals inputted to the microphone, and a speaker component for outputting audio frequency signals into said environment, said method comprising:
(a) identifying those parameters associated with acoustic feedback, including identifying time-variations in these parameters;
(b) cancelling the effects of said acoustic feedback in response to identification of the parameters associated therewith; and
(c) wherein the step of identifying those parameters associated with acoustic feedback utilizes a pseudo-random noise source and is carried out at least during a short interval immediately following system turn-on, or threshold gain change, and the step of cancelling the effects of said acoustic feedback is accomplished by a correction circuit whose parameters are set in accordance with the identified parameters and which feeds back to said amplifier component, a feedback signal whose phase is approximately opposite to the phase of the acoustic feedback and whose amplitude is approximately the same as the amplitude of the acoustic feedback.

48. A method according to claim 47 wherein the identification of said parameters is carried out periodically after system turn-on.

49. A method according to claim 47 wherein the identification of said parameters is carried out at fixed time intervals, and the parameters of the correction circuit are reset at fixed time intervals.

50. A method according to claim 47 wherein identification is based on minimizing the squared integrated error between the output of the microphone and the output of the correction circuit.

51. A method according to claim 49 wherein identification is based on minimizing the squared integrated error between the output of the microphone and the output of the correction circuit.

52. A method according to claim 50 wherein identification is based on minimizing the gradient of the squared integrated error between the output of the microphone and the output of the correction circuit.

53. A method according to claim 52 wherein minimization of the gradient of the squared integrated error is done sequentially in time by an iterative process.

54. A method according to claim 51 wherein identification is based on minimizing the gradient of the squared integrated error between the output of the microphone and the output of the correction circuit.

55. A method according to claim 54 wherein minimization of the gradient of the squared integrated error is done sequentially in time by an iterative process.

56. Apparatus comprising:
(a) a microphone component for producing an output audio signal in response to an applied input audio signals;
(b) amplifier means including a correction circuit having an adjustable transfer function for producing an amplified output in response to an applied input audio signal;
(c) a speaker component for broadcasting audio signals into an accoustic environment in response to an input audio signal;
(d) an identifier circuit means;
(e) switch means for selectively connecting either said identifier circuit means, or said amplifier means between the microphone and speaker components;
(f) said identifier means being constructed and arranged to identify those parameters associated with acoustic feedback when said switch means connects said identifier circuit means between the microphone and speaker components; and
(g) means responsive to parameters identified by said identifier means for adjusting the transfer function of said correction circuit such that acoustic feedback between the speaker and the microphone component is substantially cancelled without attenuating audio frequencies when the switch means interconnects said amplifier means between the microphone and speaker components.

57. Apparatus according to claim 56 wherein said identifier circuit means includes a noise generator for generating noise, and cross-correlation means, said switch means being constructed and arranged such that when said identifier circuit means is interconnected between said microphone and said speaker components, noise from said generator is applied to both the cross-correlator and said speaker component, and said cross-correlator cross-correlates the output of said microphone component with said noise to produce an output that identifies the parameters associated with acoustic feedback.

58. Apparatus according to claim 57 including configuration means responsive to the application of power to the amplifier means for interconnecting said identifier circuit means between the microphone and speaker components for a predetermined period of time.

59. Apparatus according to claim 57 including configuration means responsive to a threshold change in gain of the amplifier means for interconnecting said identifier circuit means between the microphone and speaker components for a predetermined period of time.

60. Apparatus according to claim 57 including configuration means responsive to either the application of power to the amplifier means, or a threshold change in gain of the amplifier means for interconnecting said identifier circuit means between the microphone and speaker components for a predetermined period of time.

* * * * *